United States Patent [19]
Huang et al.

[11] Patent Number: 5,700,703
[45] Date of Patent: Dec. 23, 1997

[54] METHOD OF FABRICATING BURIED CONTROL ELEMENTS IN SEMICONDUCTOR DEVICES

[75] Inventors: Jenn-Hwa Huang, Gilbert; Christine Thero, Scottsdale; Kumar Shiralagi, Chandler, all of Ariz.

[73] Assignee: Motorola, Schaumburg, Ill.

[21] Appl. No.: 692,687

[22] Filed: Aug. 6, 1996

[51] Int. Cl.$^6$ ................................................ H01L 21/265
[52] U.S. Cl. ..................... 437/40; 437/29; 437/41; 437/911
[58] Field of Search ................. 437/29, 40, 41, 437/100, 911–914; 148/DIG. 148, DIG. 154; 257/134, 136, 139, 192, 199, 787

[56] References Cited

U.S. PATENT DOCUMENTS

| | | | |
|---|---|---|---|
| 5,196,358 | 3/1993 | Boos | 437/911 |
| 5,318,915 | 6/1994 | Baliga et al. | 437/100 |
| 5,378,642 | 1/1995 | Brown et al. | 437/40 |
| 5,385,855 | 1/1995 | Brown et al. | 437/100 |
| 5,486,484 | 1/1996 | Malhi | 437/100 |
| 5,500,377 | 3/1996 | Flores et al. | 437/911 |
| 5,523,246 | 6/1996 | Yang | 437/29 |
| 5,585,304 | 12/1996 | Hayashi et al. | 148/DIG. 148 |
| 5,641,695 | 6/1997 | Moore et al. | 437/911 |

*Primary Examiner*—John Niebling
*Assistant Examiner*—Michael S. Lebentritt
*Attorney, Agent, or Firm*—Eugene A. Parsons

[57] ABSTRACT

A method of fabricating buried control elements in a semiconductor device by providing a substrate and forming an epitaxial layer on the substrate. A native oxide is formed on the surface, and a mask is then positioned adjacent the surface so as to define a growth area and an unmasked portion. A bright light is selectively directed to grow an oxide film on the unmasked portion of the surface. After forming the oxide film, the native oxide on the growth area is desorbed and a buried control element layer is grown on the epitaxial layer. Subsequently, the oxide film is desorbed and the epitaxial layer is regrown, thereby burying the buried control element layer.

12 Claims, 2 Drawing Sheets

METHOD OF FABRICATING BURIED CONTROL ELEMENTS IN SEMICONDUCTOR DEVICES

FIELD OF THE INVENTION

This invention relates to methods of fabricating semiconductor devices, and more specifically to methods of fabricating buried control elements.

BACKGROUND OF THE INVENTION

During semiconductor device fabrication, geographic features of the device are conventionally determined by lithographic patterning. A photomask containing pattern information is prepared for each layer. An image of the photomask is projected onto the surface of a semiconductor substrate after the substrate is coated with a thin layer of photoresist. The pattern image is developed, and the exposed photo-sensitive material, in the case of a positive photoresist, is removed chemically. The desired pattern is thereby transferred from the photomask to the photoresist on the surface of the device being fabricated. The remaining photoresist serves to define areas where subsequent process steps such as etching, deposition and doping can occur. Once the desired process step has been accomplished, the remaining photoresist is removed.

One problem that arises is that the structure or substrate (generally a wafer) must be removed from the growth chamber to remove the masking material. The structure is then masked again and reintroduced into the growth chamber for re-growth.

Generally, in these prior art methods of fabricating semiconductor devices, etching is required to remove unwanted material and masks are removed by etching, solvent, or the like. During the etching and/or mask removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

In addition to the etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Buried control elements are used in many semiconductor devices, such as Field effect transistors and the like. In the formation of the buried control elements, a first epitaxial layer is formed on the surface of a substrate. A second epitaxial layer is formed on the first epitaxial layer. This second epitaxial layer is patterned to become the buried control element. This second epitaxial layer is patterned using photoresist and etching. The first epitaxial layer is then regrown, burying the control element. This is a simplified description of a process well known in the art, but includes many complex and time consuming steps. Using photoresist introduces issues of contamination, therefore dedicated epitaxial reactors are required. After patterning, the wafer is processed as described above, then placed back in the epi reactor for regrowth. Removing a wafer during processing adds to the time and cost involved, as well as the potential for developing flaws and impurities. Furthermore, etching tends to create surface defects which degrade the quality of the regrown epitaxial layer.

It would be highly advantageous, therefore, to remedy the foregoing and other deficiencies inherent in the prior art.

Accordingly, it is an object of the present invention to provide a new and improved method of fabricating buried control elements in semiconductor devices.

Another object of the invention is to provide a method of fabricating buried control elements without employing photoresist.

A further object of the present invention is to provide a method of fabricating FET devices.

And another object of the invention is to provide a method of fabricating buried control elements accomplished in-situ.

Yet another object of the invention is to provide a method of fabricating buried control elements without etching.

SUMMARY OF THE INVENTION

Briefly, to achieve the desired objects of the instant invention in accordance with a preferred embodiment thereof, provided is a method of fabricating buried control elements in a semiconductor device including the steps of providing a substrate and forming an epitaxial layer on the substrate. A native oxide is formed on the surface, and a mask is then positioned adjacent the surface so as to define a growth area and an unmasked portion. A bright light is selectively directed to grow an oxide film on the unmasked portion of the surface. After forming the oxide film, the native oxide on the growth area is desorbed and a buried control element layer is grown on the epitaxial layer. Subsequently, the oxide film is desorbed and the epitaxial layer is regrown, thereby burying the buried control element layer.

Also provided is a method of fabricating a vertical field effect transistor device. The method includes the steps of providing a substrate having a first conductivity type. An epitaxial layer is formed on the substrate, the epitaxial layer having the first conductivity type and a surface with a native oxide thereon. A mask is positioned on the surface so as to define a growth area and an unmasked portion on the surface. Ultraviolet light is directed onto the unmasked portion of the surface to grow an oxide film on the unmasked portion of the surface. The mask is removed and the substrate is introduced into a growth chamber and heated to a first temperature to desorb the native oxide in the growth area. A buried control element layer having a second conductivity type is selectively grown on the exposed growth area, utilizing the oxide film as a mask. The substrate is heated in the growth chamber to a second temperature, higher than the first temperature, to desorb the oxide film, and the epitaxial layer is regrown, thereby burying the buried control element layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENTS

Figure 1:
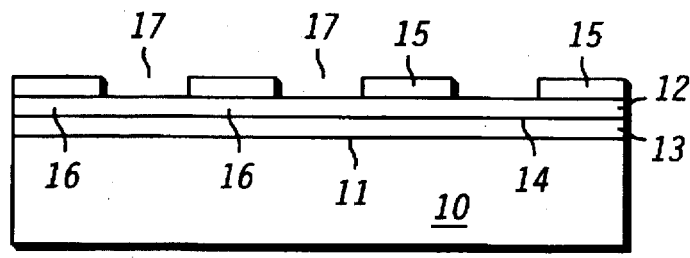
FIGS. 1-4 are simplified sectional views of a substrate, illustrating several sequential steps in a masking process in accordance with the fabrication method of the present invention.
Figure 2:
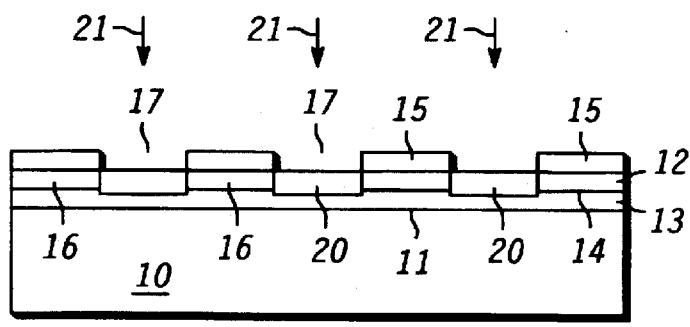

Turning now to the drawings in which like reference characters indicate corresponding elements throughout the several views, attention is first directed to FIGS. 1-4 which illustrate steps in a method of fabricating buried control elements of semiconductor devices in accordance with the present invention. Specifically, the semiconductor device being fabricated in the figures is a vertical field effect transistor (VFET). Referring specifically to FIG. 1, a simplified sectional view of a substrate 10 having a planar surface 11 is illustrated. An epitaxial layer 13, having a planar surface 14 is formed on surface 11. In this specific embodiment, substrate 10 is formed of doped gallium arsenide (GaAs) having N+ type conductivity, but it will be understood by those skilled in the art that other materials or conductivity types, such as silicon, silicon carbide, etc., P type conductivity, known in the art might be utilized. Specifically, throughout this description, N type and P type conductivity may be switched in other device configurations as are known. Furthermore, each conductivity type may have a lesser concentration of dopant (N− or P−) or a greater concentration (N+ or P+).

Epitaxial layer 13, of crystalline, or semiconductor, material is grown on surface 11 of substrate 10. Layer 13 can be lattice matched with the material of substrate 10, for instance, in the preferred embodiment doped gallium arsenide having N− type conductivity is selectively grown at 570° C.–590° C. and lattice matched to the gallium arsenide of substrate 10. Generally, a thin layer 12 of native oxide will form on planar surface 14 of epitaxial layer 13 if epitaxial layer 13 has been exposed to air or an oxygen containing environment. Layer 12 of oxide is approximately 20 angstroms thick and forms on epitaxial layer 13 whenever it is exposed to air (ambient) or an oxygen containing environment for a short time.

A mask 15 is positioned adjacent to surface 14 of native oxide layer 12 for patterning surface 14, as will be explained presently. Mask 15 may be an oxide mask, simply a shadow or metal mask or it can be formed in the well known manner with photolithography. In some instances, such as during the use of steppers and the like, the mask may be positioned at some distance from the surface of the wafer, substrate, or epitaxial layer. Because of the interaction (alignment techniques) this distance is still considered to be "adjacent the surface" for purposes of this disclosure. In this embodiment, mask 15 is positioned on layer 12 of native oxide, so as to define one or more growth areas 16 on surface 14 beneath mask 15 and one or more unmasked portions 17 on layer 12.

A second oxide layer 20 is grown on unmasked portions 17 of the native oxide (see FIG. 2) and, as will be understood by those skilled in the art, will form with the native oxide as a portion thereof. Unmasked portions 17 of surface 14 are exposed to a bright light preferably including deep ultraviolet. The bright light may be, for example, the type typically used in aligners, steppers, or E-beam devices in the semiconductor industry. The term "deep ultraviolet" refers to light in the ultraviolet range, generally with a wavelength in the range of 180 to 250 nanometers. In the present specific example, it is believed that the 185 nm light generates ozone due to optical excitation. Therefore, excitation wavelength that is most suitable for efficient ozone generation is also the most efficient to use, although virtually any ultraviolet light will produce the desired result. It is believed that exposure to other wavelengths, such as 248 nm in a specific example, modifies the composition of the surface oxide by forming a different kind of oxide or complex oxide molecules that are more stable than the native oxide. The exposure to light can be performed under a lamp. However, when the light is collimated, as in an aligner or stepper, sharp features can be defined in unmasked portion 17. In a preferred method of forming second oxide layer 20, epitaxial layer 13 is exposed to an ultraviolet source in ambient conditions (air), i.e. no special chamber, etc., to expose the unmasked portions 17 of epitaxial layer 13 to a combination of ultraviolet rays and ozone. The UV-ozone process grows a much thicker and denser layer of oxide than the native oxide. While other methods of growing second oxide layer 20 may be devised and used, it should be understood that second oxide layer 20 is formed sufficiently thicker and denser than the native oxide so that selective removal of the native oxide can be accomplished, as will be explained presently.

Figure 3:
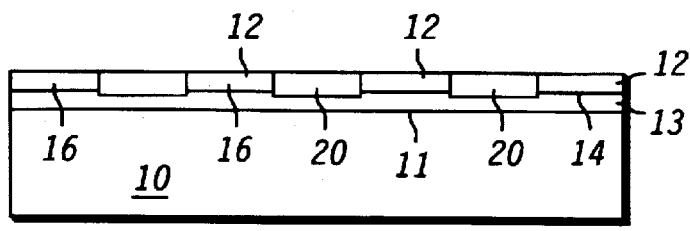
Figure 4:
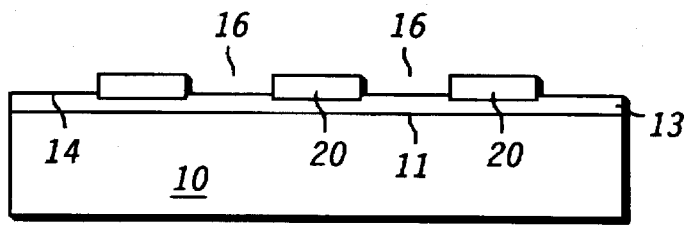

Once oxide layer 20 is grown, mask 15 is removed to expose growth areas 16, as illustrated in FIG. 3. Substrate 10 is then introduced into a growth chamber (not shown) and heated to desorb the native oxide that is present on growth areas 16. In the present example in which a gallium arsenide substrate is utilized, the substrate is heated in the growth chamber to approximately 580° C.–600° C. to desorb the native oxide in the exposed growth area. Epitaxial layer 13 with oxide-free growth areas 16 is illustrated in FIG. 4. A mask has now been formed without employing photoresist.

Figure 5:
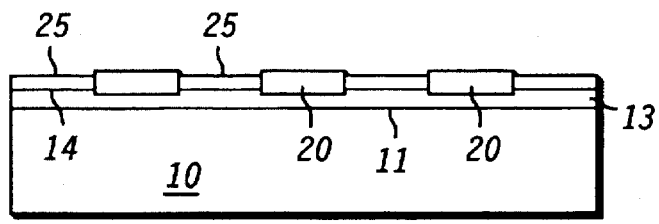
FIG. 5 is a simplified sectional view of the substrate of FIG. 4 with a buried control element grown on the surface.

While retaining substrate 10 in the growth chamber, selective growth of buried control element layer 25 in growth areas 16 is performed, as illustrated in FIG. 5. Buried control element layer 25 can be lattice matched with the material of epitaxial layer 13, for instance, gallium arsenide is selectively grown at 570° C.–590° C. and lattice matched to the gallium arsenide of epitaxial layer 13. In this instance, buried control element layer 25 is formed of doped GaAs of p+ type conductivity. With oxide layer 20 in place as a mask for further growth, a predetermined amount of material for buried control element layer 25 is selectively grown in area (or areas) 16. For purposes of this disclosure, "selective growth" or "selectively grown" is defined as growing only in the specific or designated area. Thus, in this example, buried control element layer 25 grows only in growth areas 16. Further, buried control element layer 25 generally grows in a crystalline form so that growth rates and shapes are crystallographic dependent, i.e. the rate and shape of growth are dependent upon the type of material being utilized for buried control element layer 25.

Figure 6:
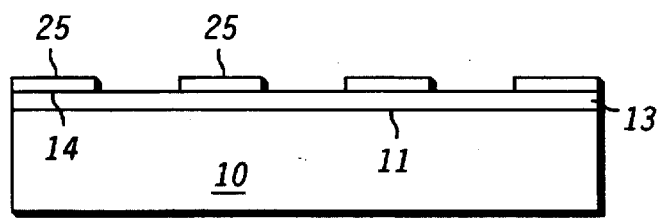
FIG. 6 is a simplified sectional view of the substrate with the mask removed.

Once the desired amount of material for buried control element layer 25 is grown in growth areas 16, substrate 10 is heated to a higher temperature under high group V flux in the growth chamber to desorb oxide layer 20. In the present example in which the substrate is gallium arsenide, substrate 10 is heated to approximately 640° C. under high arsenic flux. The higher arsenic flux prevents gallium arsenide desorption during the desorption of oxide layer 20, resulting in the structure illustrated in FIG. 6. Thus, the mask utilized for patterned growth of buried control element layer 25 is desorbed, or removed, in situ, i.e. without the need to remove substrate 10 from the growth chamber.

Figure 7:
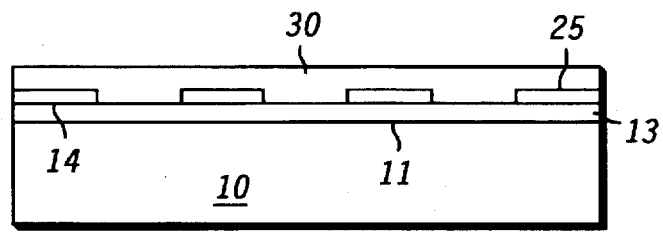
FIG. 7 is a simplified sectional view of the substrate illustrating epitaxial regrowth to complete the formation of buried control elements.

Substrate 10 with buried control element layer 25 is illustrated in FIG. 7. An epitaxial layer 30 is grown or deposited on the surface of buried control element layer 25 and on the exposed surface of epitaxial layer 13, burying buried control element layer 25. Thus, re-growth is performed without having to remove structure 10 from the growth chamber. In the specific example of fabricating a vertical FET, by employing the method of the present invention, the regrowth can be controlled so that a 0.5 micron or thinner layer buries buried control element layer 25.

Figure 8:
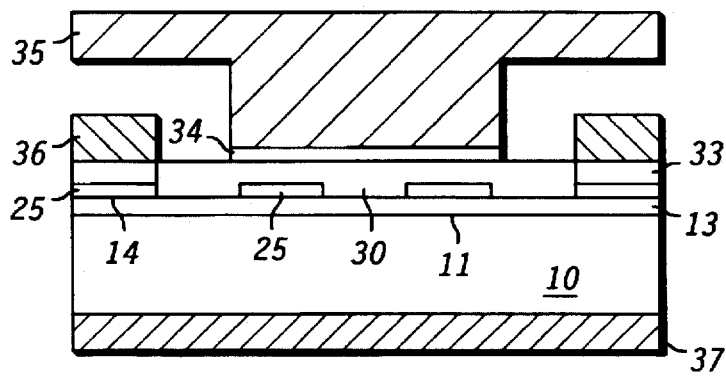
FIG. 8 is a simplified sectional view of a substantially completed vertical FET device fabricated according to the method of the invention shown in FIGS. 1-7.

Referring to FIG. 8, a substantially complete vertical FET device 32 has been fabricated. A contact layer 34 is grown on epitaxial layer 30 for contacting purposes. This layer is preferably GaAs having N+ type conductivity. Contacts (not shown) to substrate 10 and contact layer 34 can easily be made by conventional NiGeW, NiGeAu, or other alloys. A contact to buried control element 25 can be achieved by Be implant 33 or mesa etching (not shown) to buried control element 25. NiGeW or other suitable ohmic alloys can again be used as the ohmic contact, including a source contact 35 and control contacts 36. A drain contact 37 is deposited on the reverse side of substrate 10 at some convenient time during the fabrication process. These steps are not shown or described in more detail as they are well known in the art.

Thus, an improved fabrication processes is disclosed which provides a new and improved method of forming buried control elements during semiconductor device fabrication and particularly vertical FET fabrication. The new and improved method of forming buried control elements does not require removal of the substrate from the processing chamber to remove the mask. Because the new and improved method of forming buried control elements does not require the introduction and removal of wafers or substrates from processing chambers several times in sequence during the fabrication of semiconductor devices, the fabrication process is much simpler and includes less chance of contamination of the devices. The present novel process allows selective growth and further re-growth, all in-situ, without exposure to air and contamination during the intermediate processing steps between epitaxy, etc. By eliminating air and other contaminant exposure between steps, the novel process ensures good quality in subsequent epitaxial steps.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating buried control elements in a semiconductor device comprising the steps of:

providing a substrate;

forming an epitaxial layer on the substrate, the epitaxial layer having a surface;

forming a native oxide on the epitaxial layer;

positioning a mask adjacent the surface so as to define a growth area and an unmasked portion on the surface;

selectively directing a bright light onto the unmasked portion of the surface to grow an oxide film on the unmasked portion of the surface;

desorbing the native oxide on the growth area leaving the oxide film;

selectively growing a buried control element layer on the epitaxial layer;

desorbing the oxide film; and regrowing an epitaxial layer, thereby burying the buried control element layer.

2. A method as claimed in claim 1 wherein the step of selectively directing the bright light onto the unmasked portion includes selectively directing ultraviolet light onto the unmasked portion.

3. A method as claimed in claim 2 wherein the step of selectively directing ultraviolet light onto the unmasked portion includes directing deep ultraviolet light onto the unmasked portion of the surface.

4. A method as claimed in claim 3 wherein the step of selectively directing ultraviolet light onto the unmasked portion includes directing ultraviolet light with a wavelength in a range of 180 nm to 250 nm.

5. A method as claimed in claim 2 wherein the step of desorbing the native oxide includes heating the substrate in the growth chamber to a first temperature.

6. A method as claimed in claim 5 wherein the step of desorbing the oxide film includes heating the substrate in the growth chamber to a second temperature, higher than the first temperature, to desorb the oxide film.

7. A method of fabricating a vertical field effect transistor device comprising the steps of:

providing a substrate having a first conductivity type;

forming an epitaxial layer on the substrate, the epitaxial layer having the first conductivity type and a surface with a native oxide thereon;

positioning a mask on the surface so as to define a growth area and an unmasked portion on the surface;

directing ultraviolet light onto the unmasked portion of the surface to grow an oxide film on the unmasked portion of the surface;

removing the mask and introducing the substrate into a growth chamber and heating the substrate to a first temperature to desorb the native oxide in the growth area;

selectively growing, on the exposed growth area, a buried control element layer having a second conductivity type utilizing the oxide film as a mask;

heating the substrate in the growth chamber to a second temperature, higher than the first temperature, to desorb the oxide film; and regrowing an epitaxial layer, thereby burying the buried control element layer.

8. A method as claimed in claim 7 wherein the regrown epitaxial layer burying the control element layer is less than 5 microns thick.

9. A method as claimed in claim 7 further including the step of forming a contact layer having the first type conductivity on the regrown epitaxial layer.

10. A method as claimed in claim 9 wherein the first type conductivity includes N type conductivity and the second type conductivity includes P type conductivity.

11. A method as claimed in claim 10 wherein the substrate and contact layer have N+ type conductivity, the epitaxial layer has N– type conductivity, and the buried control element layer has P+ type conductivity.

12. A method of fabricating a vertical field effect transistor device comprising the steps of:

provoding a gallium arsenide substrate having a first conductivity type;

forming an epitaxial layer of one of gallium arsenide, indium gallium arsenide, and their alloys on the gallium arsenide substrate, the epitaxial layer having the first conductivity type and a surface with a native oxide thereon;

positioning a mask on the surface so as to define a growth area and an unmasked portion on the surface;

directing ultraviolet light onto the unmasked portion of the surface to grow an oxide film on the unmasked portion of the surface;

removing the mask and introducing the substrate into a growth chamber and heating the substrate to a first temperature to desorb the native oxide in the growth area;

selectively growing, on the exposed growth area, a buried control element layer having a second conductivity type utilizing the oxide film as a mask;

heating the substrate in the growth chamber to a second temperature, higher than the first temperature, to desorb the oxide film;

regrowing an epitaxial layer, thereby burying the buried control element layer; and forming a contact layer having the first type conductivity on the regrown epitaxial layer.

* * * * *